US012699162B2

(12) United States Patent
Pavao Moreira et al.

(10) Patent No.: US 12,699,162 B2
(45) Date of Patent: Aug. 4, 2026

(54) DYNAMIC POWER MANAGEMENT SYSTEM FOR LOW POWER AND HIGH-PERFORMANCE RADAR APPLICATIONS

(71) Applicant: NXP B.V., Eindhoven (NL)

(72) Inventors: Cristian Pavao Moreira, Frouzins (FR); Koteswararao Nannapaneni, Yelahanka (IN)

(73) Assignee: NXP B.V., Eindhoven (NL)

( * ) Notice: Subject to any disclaimer, the term of this patent is extended or adjusted under 35 U.S.C. 154(b) by 294 days.

(21) Appl. No.: 18/519,182

(22) Filed: Nov. 27, 2023

(65) Prior Publication Data

US 2025/0116751 A1    Apr. 10, 2025

(30) Foreign Application Priority Data

Oct. 6, 2023    (IN) .............................. 202341067043

(51) Int. Cl.
*G01S 7/03* (2006.01)
*H03F 3/45* (2006.01)

(52) U.S. Cl.
CPC ............ *G01S 7/03* (2013.01); *H03F 3/45475* (2013.01)

(58) Field of Classification Search
CPC . G01S 7/03; G01S 7/032; G01S 7/023; H03F 3/45475; H02M 1/0045
See application file for complete search history.

(56) References Cited

U.S. PATENT DOCUMENTS

| | | | |
|---|---|---|---|
| 6,295,217 B1 | 9/2001 | Yang et al. | |
| 8,994,579 B2 * | 3/2015 | Kobayashi | H03F 3/72 |
| | | | 327/365 |
| 11,245,410 B1 * | 2/2022 | Dalla Longa | H03M 1/66 |
| 2013/0147444 A1 * | 6/2013 | Temkin | H02M 3/33523 |
| | | | 323/234 |
| 2020/0132811 A1 * | 4/2020 | Goswami | G01S 7/40 |
| 2020/0292659 A1 * | 9/2020 | Bai | G01S 13/931 |
| 2022/0308196 A1 * | 9/2022 | Rao | G01S 13/343 |

(Continued)

FOREIGN PATENT DOCUMENTS

JP    2013195156 A  *  9/2013

OTHER PUBLICATIONS

JP_2013195156_A_I_translate.pdf (Year: 2013).*

(Continued)

*Primary Examiner* — Yonghong Li

(57) ABSTRACT
A radar device including a radar function, a driver configured to control a pass device, and a radar controller. The radar function is configured for generating radar frames in a first mode for generating high isolation frames and in a second mode for generating low isolation frames. The radar function has a supply voltage input and is configured to operate with the supply voltage input at a radar supply voltage level. The radar controller configures the driver for controlling the pass device to regulate voltage provided to the supply voltage input of the radar function at the radar supply voltage level with high power supply rejection ratio to minimize ripple voltage when the radar function is in the first mode, and configures the driver to force the pass device into a bypass mode to reduce power dissipation when the radar function is in the second mode.

20 Claims, 4 Drawing Sheets

(56) References Cited

U.S. PATENT DOCUMENTS

| | | | |
|---|---|---|---|
| 2022/0326346 A1 * | 10/2022 | Kumar Y.B | ......... H02M 3/1584 |
| 2023/0324506 A1 * | 10/2023 | Belitzer | ................... G01S 7/03 |
| | | | 342/61 |

OTHER PUBLICATIONS

Kang, Yunxin et al.; "First-order Bandgap Reference Source Design with High Power Supply Rejection Ratio"; Journal of Physics: Conference Series, vol. 2405, 2022 International Conference on Electronics Technology and Artificial Intelligence (ETAI 2022); Sep. 18, 2022, Chongqing, China; DOI 10.1088/1742-6596/2405/1/012003.

* cited by examiner

DYNAMIC POWER MANAGEMENT SYSTEM FOR LOW POWER AND HIGH-PERFORMANCE RADAR APPLICATIONS

CROSS-REFERENCE TO RELATED APPLICATIONS

This application claims the priority under 35 U.S.C. § 119 of India patent application No. 202341067043, filed on 6 Oct. 2023, the contents of which are incorporated by reference herein.

BACKGROUND

Field

The present invention relates in general to radar sensors, and more particularly to a dynamic power management system for low power high-performance radar applications.

Description of the Related Art

A radar sensor is an electromagnetic device that is used for detecting characteristics of external objects or "targets" (e.g., location, distance, size, identification, etc.) at variable distances. The radar sensor transmits electromagnetic energy in an environment and receives a portion of the reflected energy in the form of an echo. Highly integrated modern radar sensors may be composed of a power management integrated circuit (PMIC) and a radar IC configured as a system on a chip (SoC). While some radar functions, such as a radar digital core or other radar digital signal processing (DSP) functions, can be directly supplied by a PMIC rail using a buck converter or the like, other critical radar functions such as transmission (TX), receiver (RX) functions, analog to digital conversion (ADC) functions, etc., should be isolated from PMIC ripple through at least one isolation barrier. Such isolation is desired to avoid spurs in the intermediate frequency (IF) spectrum which may appear as false targets. Low end radar sensors often require a low-cost housing (e.g., plastic package or the like) which require minimum sensor power dissipation.

The disadvantages of conventional radar configurations include high power dissipation of the radar sensor and its cost and the influence of PMIC ripple on radar sensor signal integrity in terms of undesired spurs and the like. A low cost PMIC presents high spur levels around the IF spectrum due to DC-DC buck converter activity in the form of ripple voltage, so that an additional barrier may be added between the PMIC and the radar IC. The additional barrier can degrade overall power efficiency of the radar sensor. The use of a PMIC with an extremely low ripple is a conventional option, but this increases overall radar sensor cost.

BRIEF DESCRIPTION OF THE DRAWINGS

Embodiments of the present invention are illustrated by way of example and are not limited by the accompanying figures. Similar references in the figures may indicate similar elements. Elements in the figures are illustrated for simplicity and clarity and have not necessarily been drawn to scale.

DETAILED DESCRIPTION

Figure 1:
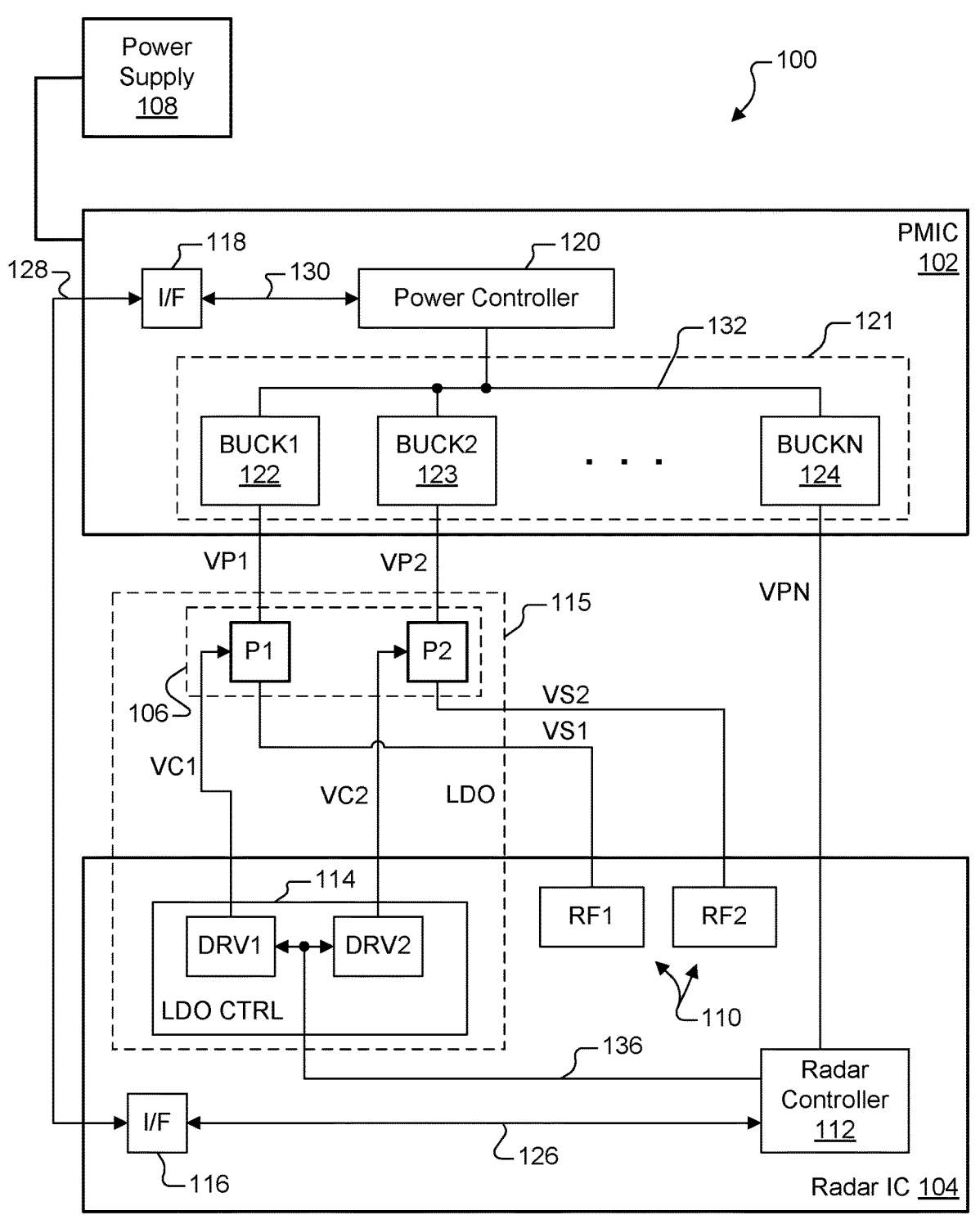
FIG. 1 is a simplified block diagram of a radar sensor implemented according to one embodiment.

An isolation barrier between power management integrated circuit (PMIC) ripple and a radar device configured as a radar integrate circuit (IC) improves signal integrity at the cost of increased power dissipation, so that a good tradeoff between power dissipation and received signal integrity becomes advantageous. The particular tradeoff may depend on the use case for a given radar session. As used herein, "use case" refers to a set of parameters or variables that define the radar application, the environment being scanned or monitored, or the desired resolution that is needed for a given radar session. The isolation barrier between the PMIC and the radar device can be built up internally (LDO regulator including controller and pass device(s) configured inside the radar IC), externally (via LDOs on the board), or in a hybrid manner, such as providing pass devices on the board with control circuitry within the radar IC. The hybrid solution generally achieves a good trade-off at the IC level between dissipation, isolation, area, and cost.

A low cost PMIC with a programmable buck converter generating different output voltage levels may be controlled by the radar device according to the use case. It is noted that in other embodiments, the PMIC may be controlled by another controller device (not shown) depending on the elements in the radar sensor and their function and role in the overall radar system. The other controller device may be configured as a microcontroller (MCU) or a processor such as a digital signal processor (DSP) or the like. Each of the different output voltages present a relatively high level of ripple. A controlled pass device is provided as a barrier between the PMIC output and the radar IC supply input. In a first mode for generating high isolation radar frames, the PMIC is programmed to output an upper voltage level and the pass device is controlled to reduce the voltage to a regulated supply voltage level needed by the radar IC while also minimizing ripple of the upper voltage level at the regulated supply voltage output. In the first mode, the radar IC generates one or more radar range and doppler data plots representative of a radar target's distance and speed, respectively, with minimal spur energy that might otherwise be caused by the ripple voltage present in the supply voltage at the upper voltage level. The high isolation mode enables more accurate results at the expense of additional power dissipation.

In a second, low power mode for generating low isolation radar frames, the PMIC is programmed to output a lower voltage level substantially at the supply voltage level needed by radar functional circuitry of the radar IC and the pass device is controlled to operate as a low resistance switch with substantially zero voltage drop. When the pass device is operated in this manner without regulation, ripple voltage present in the supply voltage at the lower voltage level is passed to the radar IC. In this low isolation mode, therefore, the radar sensor is operated at reduced power at the expense of increased spurious noise in the radar range and doppler data plots. Nonetheless, in successive radar frames one or more high isolation low noise frames may be interleaved with low isolation high noise frames to establish a suitable trade-off between performance and power dissipation. A comparison may be made between the low noise and the corresponding high noise range and doppler data plots to identify and filter out the spurious noise using digital processing techniques.

FIG. 1 is a simplified block diagram of a radar sensor 100 implemented according to one embodiment. The radar sensor 100 includes a power management integrated circuit (PMIC) 102, a radar device in the form of a radar integrated circuit (IC) 104, one or more pass devices 106, and a power supply 108. In various embodiments, the power supply 108 may be a battery (not shown), such as an automotive battery or the like, or may be another PMIC coupled to the battery. The radar IC 104 is a radar device configured for generating radar frames using one or more radar functions 110. As used herein, the term "radar function" is defined as radar circuitry of the radar IC 104 configured to perform one or more radar functions performed by the radar IC 104 when operating as part of a radar sensor. In the illustrated configuration, the radar IC 104 incorporates two radar functions 110, individually labeled RF1 and RF2, in which either one or both RF1 and RF2 may be used when generating the radar frames. In one embodiment, for example, RF1 may include circuitry forming receivers, clock generators, radar chirp generators, bias generators, built-in self-test (BIST) functions, etc., whereas RF2 may include one or more radar transmitter circuits.

The pass devices 106, individually labeled P1 and P2, are used by a low dropout (LDO) controller 114 of the radar IC 104 for controlling supply voltage provided to the radar functions RF1 and RF2, respectively. RF1 and RF2 are shown in separate voltage supply domains although they may be included in alternative configurations within the same voltage supply domain. In some configurations, the supply domains of radar transmitters may be separated from other radar functions to avoid any interference issues or to allow transmitter supply domain flexibility for controlling output power transmission. The radar IC 104 may be configured as a system on a chip (SoC) and may further include a radar controller 112, the LDO controller 114, and a control interface (I/F) 116. The LDO controller 114 and the pass devices 106 are collectively configured as an LDO regulator 115, which operates as a voltage control system that forms an isolation barrier between the PMIC 102 and the radar functions 110 as further described herein.

The PMIC 102 includes a control I/F 118, a power controller 120, and one or more DC-DC buck converters shown as N buck converters 121 individually shown as BUCK1 122, BUCK2 123, . . . , BUCKN 124. N is any suitable integer greater than zero and includes the case in which N=1 when only one buck converter 121 is provided. In general, the power supply 108 provides a supply voltage to a voltage supply input of the PMIC 102, and the PMIC 102 provides DC-DC converted power voltages to various components of the radar IC 104. The radar IC 104 may include additional circuitry (not shown) and the PMIC 102 may include additional voltage converters or regulators of the same or of different types that are used to provide supply voltages to the additional circuitry of the radar IC 104. In one embodiment, the buck converters 121 are relatively low cost converters that perform DC-DC switching with significant ripple voltage at an intermediate frequency (IF) spectrum that might otherwise interfere with operation of the radar IC 104 when generating radar frames as further described herein.

In the illustrated configuration, BUCK1 122 outputs a first power voltage VP1 to the pass device P1 and BUCK2 123 outputs a second power voltage VP2 to the pass device P2. Additional buck converters may be provided for additional pass devices and corresponding radar functions of the radar IC 104 or for other elements (not shown) in radar sensor 100, such as memory devices, controllers, drivers, other radar ICs for cascading system, etc. A last BUCK2 124 outputs an Nth power voltage VPN provided to a supply input of the radar controller 112. The pass device P1 receives VP1 and provides a first supply voltage VS1 to a supply voltage input of the radar function RF1, and the pass device P2 receives VP2 and provides a second supply voltage VS2 to a supply voltage input of the radar function RF2. The LDO controller 114 provides a first control voltage VC1 to a control terminal of the pass device P1 and provides a second control voltage VC2 to a control terminal of the pass device P2. Selected ones of the power voltages VP (e.g., VP1 and VP2) are either at an upper voltage level (UVL) or a lower voltage level (LVL). As described further herein, BUCK1 122 is instructed to provide VP1 at either an upper voltage level UVL1 or a lower voltage level LVL1, in which LVL1 has a radar supply voltage level that is suitable for operating the first radar function RF1. Similarly, BUCK2 123 is instructed to provide VP2 at either an upper voltage level UVL2 or a lower voltage level LVL2, in which LVL2 has a radar supply voltage level that is suitable for operating the second radar function RF2.

It is noted that if RF1 and RF2 are configured to operate with substantially the same supply voltage, or VS1=VS2, then UVL1=UVL2 and LVL1=LVL2. In that case a single buck converter 121 may be provided to develop a single power voltage VP provided to both pass devices P1 and P2. Also, although two radar functions RF1 and RF2 are shown for the radar IC 104, in alternative configurations any suitable number of radar functions 110 may be provided including a single radar function. Multiple different radar functions 110 may be included each operating at a different supply voltage such that LVL1 and LVL2 are different. In general, separate buck converters 121 and pass devices may be provided to develop different UVLi and LVLi voltages, in which "i" is an index value from 1 to N. When only one radar function 110 is included, only one buck converter 121 and one pass device 106 may be needed. The pass devices 106 are shown external, but may instead be incorporated within the radar IC 104 in an alternative embodiment.

A communication bus 126 communicatively links the radar controller 112 with the control interface 116, another communication bus 128 communicatively links the control interfaces 116 and 118 together, and another communication bus 130 communicatively links the control interface 118 with the power controller 120. Each of the buses 126, 128, and 130 may include one or more conductive lines and corresponding control signals. In one embodiment suitable for automotive applications and the like, the control interfaces 116 and 118 are configured as controller area network (CAN) or serial peripheral interface (SPI) interfaces for enabling automotive circuitry modules to communicate with each other. The power controller 120 communicates with each of the buck converters 121 via another communication bus 132 with one or more conductive lines and corresponding control signals. In this manner, the radar controller 112 communicates with the power controller 120 to instruct each of the buck converters 121 to provide the voltage level at their respective VPi outputs to configured voltages as further described herein.

The LDO controller 114 includes separate driver circuitry for each of the pass devices 106, including a driver DRV1 for the pass device P1 and a driver DRV2 for the pass device P2. The drivers DRV1 and DRV2 are controlled by the radar controller 112 via corresponding control signals of a control bus 136. The radar controller 112 controls each of the drivers DRV1 and DRV2 via the control bus 136 to select either a driver mode or a force mode to generate the corresponding VC control signal (VC1 or VC2) provided to respective the pass devices 106 according to a selected mode of operation. In the driver mode, one or more of the drivers DRVi are configured to control corresponding pass devices Pi to regulate the corresponding supply voltages VSi provided to corresponding radar functions RFi using corresponding power voltages VPi provided at a corresponding upper voltage level UPLi. In the force mode, one or more of the drivers DRVi are configured to force corresponding pass devices Pi into a bypass mode to operate as a switch with zero voltage drop to pass corresponding power voltages VPi provided at the lower voltage level LPLi as corresponding supply voltages VSi provided to corresponding radar functions RFi.

The radar IC 104 is configured in a first mode (M1) for generating radar frames in the form of high isolation (HI) frames or in a second mode (M2) for generating radar frames in the form of low isolation (LI) frames. In the first mode M1 for generating HI frames, the drivers DRVi and the corresponding pass device Pi are operated in the driver mode to act as a barrier to prevent ripple voltage from the corresponding buck converter (e.g., BUCK1 or BUCK2) from impacting the HI radar frames generated by the radar IC 104 using the corresponding radar functions RFi. In this manner, the ripple voltage on the power voltage VPi at UPLi provided by a corresponding buck converter 121 is substantially suppressed, filtered out, or otherwise blocked by the LDO regulator 115 when providing the corresponding supply voltage VSi to the corresponding radar function 110. As further described herein, each driver (e.g., DRV1 or DRV2) and corresponding pass device (e.g., P1 or P2) and other supporting circuitry forms an LDO having a regulation loop with a power supply rejection ratio (PSRR) that is sufficient to output the supply voltage (e.g., VS1 or VS2) while rejecting supply variation in the form of ripple voltage. The first mode M1 enables the radar IC 104 to generate HI radar frames that are isolated from buck converter ripple voltage and thus free of interference such as spurs in the IF spectrum that might otherwise appear as false targets.

In the second mode M2 for generating LI radar frames, the drivers DRVi and the corresponding pass device Pi are operated in the force mode in which the radar functions RFi are subjected to ripple voltage from the corresponding buck converter (e.g., BUCK1 or BUCK2). In this manner, the ripple voltage on the power voltage VPi at LPLi provided by a corresponding buck converter 121 is not blocked by the LDO regulator 115 when providing the corresponding supply voltage VSi to the corresponding radar function RFi. The second mode M2 enables the radar IC 104 to generate LI frames that are not isolated from buck converter ripple voltage and thus are not free of spurious interference in the IF spectrum. The second mode M2 enables generation of LI frames with reduced power dissipation of the radar sensor 100 since the power dissipated in the corresponding pass device (e.g., P1 or P2) due to step down of the input voltage is zero (VP1=VS1 or VP2=VS2). The LI frames are not free of interference caused by buck converter ripple voltage and thus have compromised integrity.

The power dissipation (Pdiss) in a pass device Pi is determined as $Pdiss\_Pi=(VPi-VSi)*Iloadi$ in which Iloadi is the current flowing into the corresponding RFi function through the pass device Pi. In the second mode M2 for generating LI frames, the radar controller 112 communicates to the power controller 120 to instruct a buck converter BUCKi to set its output voltage VPi to the lower voltage level LPLi. In order to minimize power dissipation, the lower voltage level LPLi is substantially equal to the corresponding supply voltage VSi needed by the corresponding radar function RFi, or LPLi≅VSi, so that VPi≅VSi. In addition, the radar controller 112 controls the corresponding driver DRVi to operate in the force mode to force the corresponding pass device Pi into a bypass mode to have virtually zero voltage drop between VPi and VSi. In this manner, the power dissipation of the pass device Pi in the second mode M2 is virtually zero (or otherwise negligible). The PSRR of the LDO regulator 115 in this case, however, is also very low so that ripple voltage on LPLi is effectively passed unhindered to the RFi.

In the first mode M1 for generating HI radar frames, the radar controller 112 communicates to the power controller 120 to instruct a buck converter BUCKi to set its output voltage VPi to the upper voltage level UPLi. The upper voltage level UPLi is greater than the corresponding supply voltage VSi needed by the corresponding radar function RFi, or UPLi>VSi. In addition, the radar controller 112 controls the corresponding driver DRVi to operate in the driver mode to drive the corresponding pass device Pi to regulate VSi with minimal voltage ripple. The voltage difference between UPLi and VSi is selected so that the corresponding driver DRVi can regulate VSi using the source voltage UPLi with sufficiently high PSRR to reduce or effectively minimize the ripple voltage of UPLi from passing to VSi. In this manner, UPLi is selected to empower the LDO regulator 115 to regulate VSi without ripple so that the radar IC 104 can operate with minimal spur energy at the expense of increased power dissipation. In this case, the power dissipated by the pass device Pi is $Pdiss\_Pi=(UPLi-VSi)*Iloadi$.

In one embodiment, each of the pass devices 106 is a bipolar junction transistor (BJT) or the like, which may be an N-type device (e.g., NPN) or a P-type device (e.g., PNP) depending upon the driver configuration. Alternative pass devices are contemplated, such as other types of transistors including a field-effect transistor (FET), a junction FET (JFET) or a metal-oxide semiconductor FEF (MOSFET) or the like, including N-channel or P-channel FETs, JFETs, or MOSFETs. In general, each of the pass devices 106 has a control terminal (e.g., base terminal or gate terminal or the like) receiving a corresponding control signal VC from the LDO controller 114, and has current terminals (e.g., collector and emitter terminals or drain and source terminals, etc.) coupled between the VP output of a respective buck converter 121 and the supply voltage VS input of a corresponding radar function 110. Such BJT or FET or MOS type transistors or the like are driven into saturation mode by a corresponding driver DRVi in the driver mode for regulating voltage to minimize ripple voltage. Also, such BJT or FET or MOS type transistors or the like are forced into bypass mode by a corresponding driver DRVi in the force mode to operate as zero-voltage switches to minimize power dissipation.

Figure 2:
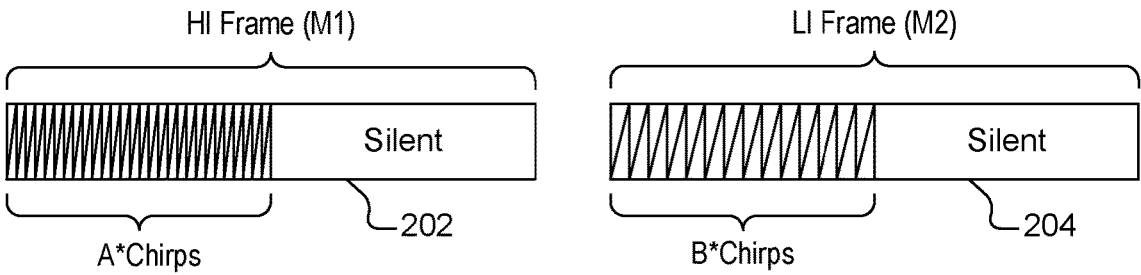
FIG. 2 is a simplified block diagram illustrating a high isolation (HI) radar frame generated in mode M1 and a low isolation (LI) radar frame generated in mode M2 according to one embodiment.

FIG. 2 is a simplified block diagram illustrating an HI radar frame generated in mode M1 and an LI radar frame generated in mode M2 according to one embodiment. In the illustrated embodiment, an HI frame 202 is generated in mode M1 and an LI frame 204 is generated in mode M2. The HI frame 202 includes a sequential series of a number A "chirps" that are transmitted during a chirp period which is followed by a silent period. Similarly, the LI frame 204 includes a sequential series of a number B chirps that are transmitted during a chirp period followed by a silent period. Each chirp is a single tone having a frequency that varies with time. In linear frequency modulated continuous wave (FMCW) radars, each chirp has a frequency that varies linearly in time for a predetermined chirp period. The duty cycle for each radar frame is the ratio between the chirp period (period in which chirps are transmitted) versus the silent period duration. Ideally, each radar frame would have a 100% duty cycle with a chirp period and no silent period. The radar sensor 100, however, consumes a significant amount of power during chirp periods raising thermal and power dissipation issues. In this manner, a 50% duty cycle is generally a suitable compromise between target detection and power dissipation for each of the radar frames.

During the chirp period, the radar IC 104 operates in both a transmission (TX) mode for transmitting the chirps and a reception (RX) mode for receiving and detecting responses from the environment which may be evaluated to identify any targets of interest. During the silent period, the radar IC 104 operates with no transmission or reception although remains in standby for the next frame. The A and B values, which define the number of chirps transmitted during the chirp period for the respective HI and LI frames, may be fixed or programmable values that may be the same (i.e., A=B) or different depending upon the use case.

Figure 3:
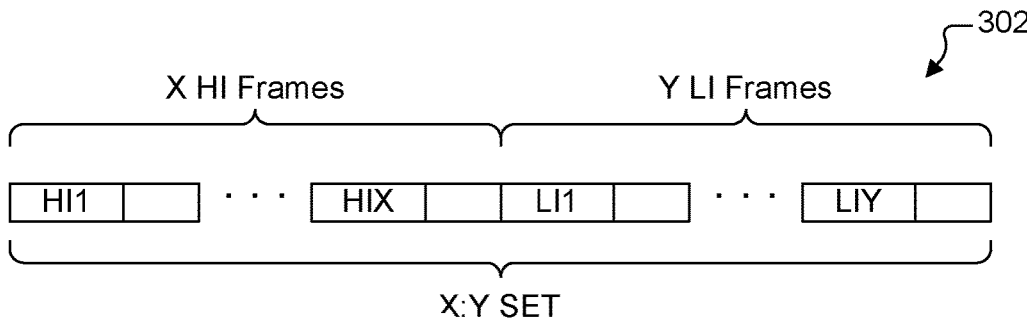
FIG. 3 is a simplified block diagram illustrating an exemplary frame set according to one embodiment.

FIG. 3 is a simplified block diagram illustrating an exemplary frame set 302 according to one embodiment. The frame set 302 is a programmable number X of HI frames (HI1, . . . , HIX) that are transmitted immediately followed by transmission of another programmable number Y of LI frames (LI1, . . . , LIY). The values X and Y determine a set ratio X:Y that are provided according to a radar profile that is loaded before a radar session performed by the radar IC 104. X is an integer of 0 or greater and is typically at least 1 for each set. Y is also an integer of 0 or greater, in which Y may be 1 or more to reduce power dissipation but may also be 0 when interleaved mode is not used for a given use case. HI frames are free of ripple voltage interference and may be used as a reference radar frame for one or more subsequent LI frames in a given set. LI frames are radar frames that may be tainted with ripple voltage causing spurs that might otherwise cause false targets. The use of at least one HI reference frame per frame set establishes a clean radar scene that may be used as a reference for spur mitigation techniques applied to one or more LI frames.

A typical interleaved frame set includes one HI radar frame followed by one or more LI radar frames. The HI frame provides a clear radar scene that may be used to mitigate spurs generated in the subsequent LI frames of the same frame set. Although any number of LI frames may be included, later LI frames are separated by a greater amount time from the reference HI frame so that mitigation techniques may become less useful with subsequent LI frames. A frame set with only LI frames may be used to decrease power dissipation while gathering a limited amount of information tainted by spur energy. A non-interleaved frame set with only HI frames provides the highest quality information at the cost of higher power dissipation. A possible variation is to include multiple HI frames and one or more LI frames per frame set for a given use case to reduce power dissipation as compared to non-interleaved radar sessions.

Figure 4:
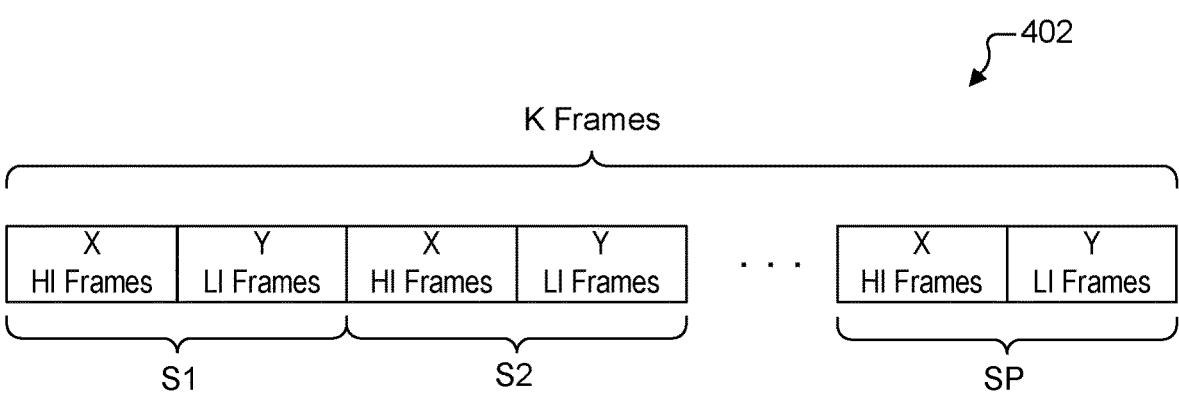
FIG. 4 is a simplified block diagram illustrating an exemplary radar session including a total number K of radar frames according to one embodiment.

FIG. 4 is a simplified block diagram illustrating an exemplary radar session 402 including a total number K of radar frames according to one embodiment. K is an integer number that may be at least X+Y (e.g., total number of radar frames per frame set) and which is typically a multiple M of X+Y, or K=M*(X+Y) in which an asterisk "*" denotes multiplication. As shown, the radar session 402 includes a sequential series of P frame sets S1, S2, . . . , SP in which each frame set S1-SP includes X HI frames followed by Y LI frames such as that shown by the frame set 302. A radar profile for a radar session 402 specifies X, Y, and K. It is noted that K may be specified independently of X and Y such that the radar session 402 may terminate when K frames are transmitted even when in the middle of a frame set S1-SP.

Figure 5:
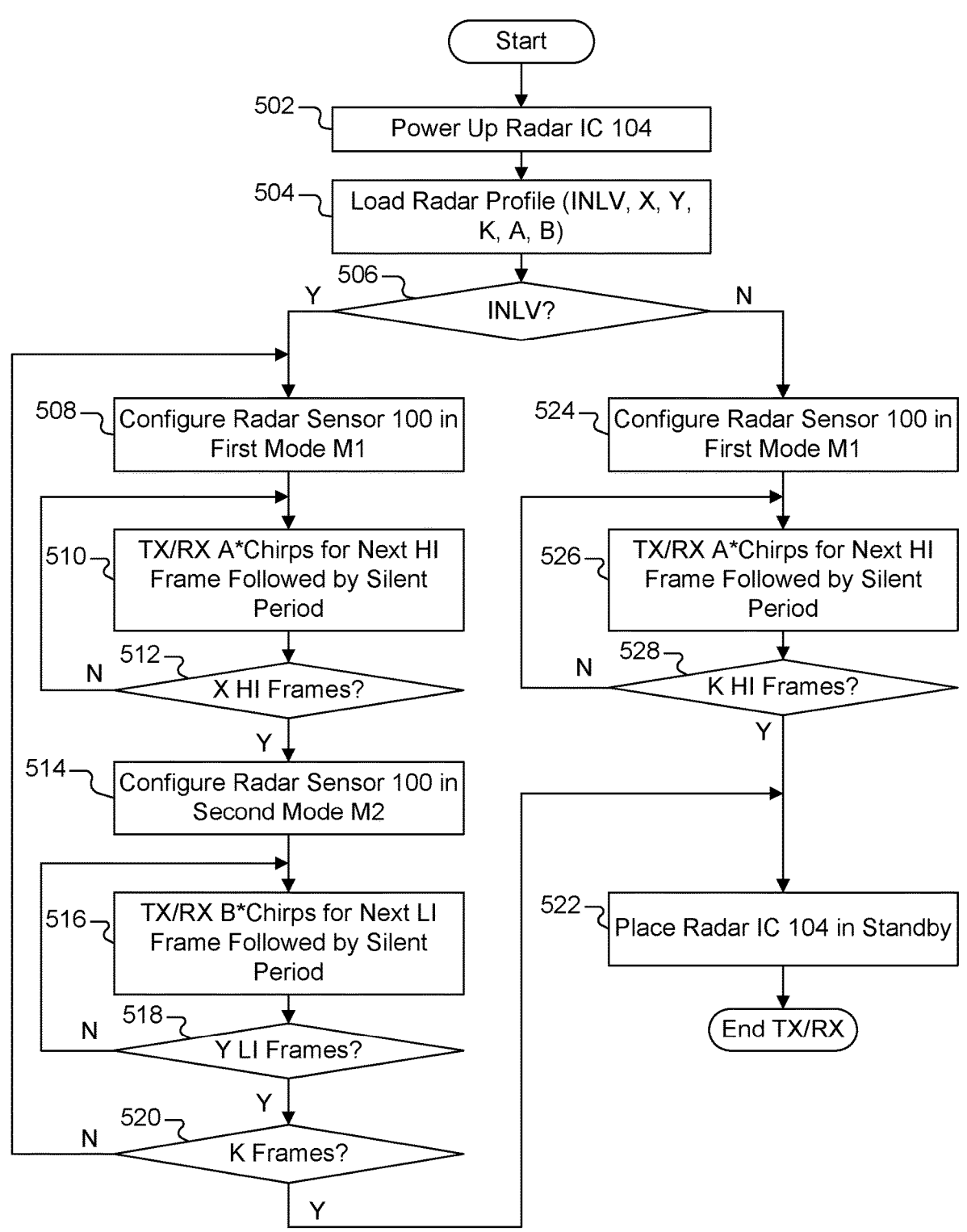
FIG. 5 is a flowchart diagram illustrating operation of the radar sensor of FIG. 1 performing the radar session of FIG. 4 according to one embodiment.

FIG. 5 is a flowchart diagram illustrating operation of the radar sensor 100 performing the radar session 402 according to one embodiment. At a first block 502, the radar IC 104 is powered up either from a standby mode or from a powered down state (or off state). At next block 504, a radar profile is loaded by the radar controller 112 for the radar session 402 according to the applicable use case. The radar profile may include a significant amount of information regarding the radar session, including, for example, chirp information (e.g., start/stop frequency, chip bandwidth, etc.), receiver information (e.g., gain settings, filter settings, etc.), transmitter information (e.g., power level, phase information, etc.), analog to digital converter (ADC) information (e.g., sampling rate), etc. For purposes of the present disclosure, however, the radar profile also includes an interleave value INLV, the X, Y, and K values for determining the set ratio X:Y and the total number of frames to be performed in the radar session 402, and A and B values for determining the number of chirps for the HI frames and LI frames, respectively. INLV is a Boolean value that determines whether the radar session 402 includes any LI frames interleaved with HI frames or whether the radar session 402 is operating in a non-interleaved mode in which the radar session only includes HI frames. The A and B values may be predetermined for the radar sessions of a given implementation of the radar sensor 100.

At next block 506, the INLV value is queried to determine whether the radar session 402 includes interleaved HI and LI frames. When INLV is true, operation advances to block 508 in which the radar sensor 100 is configured by the radar controller 112 to operate in the first mode M1 for generating one or more HI frames of the current set of frames. This includes instructing applicable buck converters 121 to generate corresponding power voltages VPi at their corresponding upper voltage levels UVLi, configuring applicable drivers DRVi of the LDO regulator 115 to operate corresponding pass device Pi in driver mode to regulate the supply voltages VSi to substantially reduce or minimize ripple voltage from VPi to eliminate spur energy in the HI frames at the expense of increased power dissipation. Operation then advances to block 510 in which the radar IC 104 transmits A chirps for the first or next HI frame while simultaneously operating in RX mode to receive reflected information for processing, in which the chirp period is followed by a silent period. At next block 512, it is queried whether X HI frames have been generated. If not, operation loops back to block 510 which is repeated for the next HI frame of the current frame set.

When X HI frames are completed as determined at block 512, operation advances to block 514 in which the radar sensor 100 is configured by the radar controller 112 to operate in second mode M2 for generating one or more LI frames of the current frame set. This includes instructing applicable buck converters 121 to generate corresponding power voltages VPi at their corresponding lower voltage levels LVLi, configuring applicable drivers DRVi of the LDO regulator 115 to force corresponding pass devices Pi into bypass mode such that ripple voltage from VPi is passed to VSi to reduce power dissipation at the expense of spur energy present in the LI frames. Operation then advances to block 516 in which the radar IC 104 transmits B chirps for the first or next LI frame while simultaneously operating in RX mode to receive reflected information for processing, in which the chirp period is followed by a silent period. At next block 518, it is queried whether Y LI frames have been generated. If not, operation loops back to block 516 which is repeated for the next LI frame of the current frame set. When Y LI frames are completed as determined at block 518 for the current set, operation advances to block 520 to determine whether the total number of frames K have been generated.

At block 520, if K frames have not yet been completed, then operation loops back to block 508 in which the radar sensor 100 is again reconfigured to operation in the first mode M1 to begin the next frame set. Operation repeats in which it loops between blocks 508 to 520 until K frames are completed. Generally, the K frames includes multiple frame sets in which each set includes X HI frames followed by Y LI frames as shown in FIG. 4. It is noted that the K parameter may be implemented instead as a running count in which the radar session 402 is completed when a total of K frames have been generated regardless of whether the last set of frames has been completed. Upon completion of K frames as determined at block 520, operation advances to block 522 in which the radar IC 104 is placed in standby mode (or other low power mode), and the current radar session 402 is competed.

Referring back to block 506, if INLV is false, operation advances instead to block 524 in which the radar sensor 100 is configured by the radar controller 112 to operate in the first mode M1 for one or more HI frames up to a total of K HI frames. Again, HI mode includes configuring either one or both of the drivers DRV1 and DRV2 of the LDO regulator 115 to operate in driver mode to regulate the supply voltages VS1 and VS2 to substantially reduce or minimize ripple voltage from VP1 and VP2 to eliminate spur energy in the HI frames at the expense of increased power dissipation. Non-interleaved mode of operation may be favored for use cases in which it is desired to minimize spur energy for more accurate results. Operation then advances to block 526 in which the radar sensor transmits A chirps for the first or next HI frame while simultaneously operating in RX mode to receive reflected information for processing, followed by a silent period. At next block 528, it is queried whether K HI frames are completed, and if not, operation loops back to block 526 which is repeated until K HI frames have been completed. When K HI frames have been completed, operation advances to block 522 in which the radar IC 104 is placed in standby mode (or other low power mode), and the current radar session 402 is competed.

Figure 6:
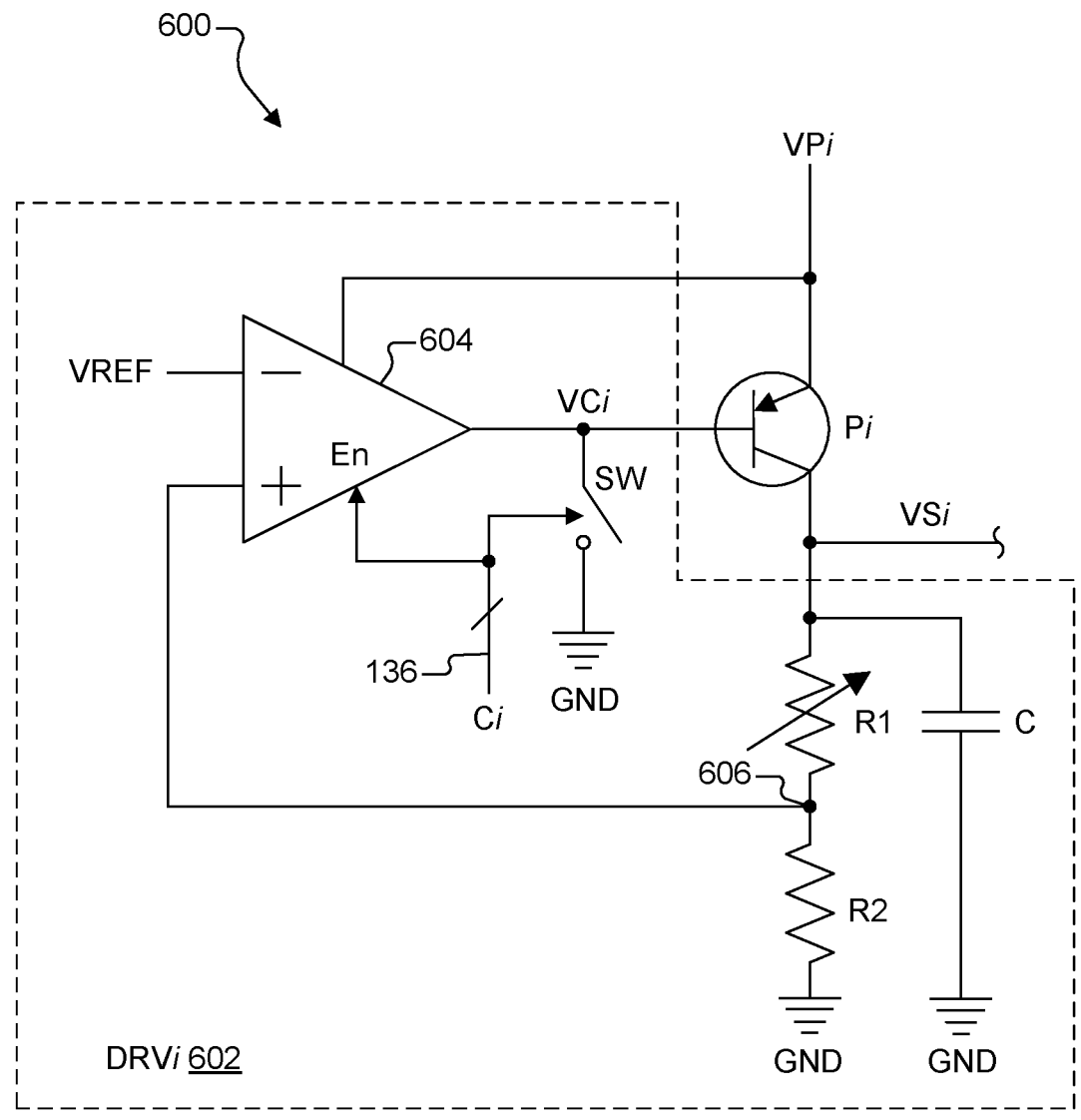
FIG. 6 is a schematic diagram of an exemplary LDO regulator including an exemplary driver coupled to a corresponding exemplary pass device for implementing either one or both of the drivers and corresponding pass devices of the LDO regulator of FIG. 1 according to one embodiment.

FIG. 6 is a schematic diagram of an exemplary LDO regulator 600 including an exemplary driver DRVi 602 coupled to a corresponding exemplary pass device Pi for implementing either one or both of the drivers DRV1 and DRV2 and corresponding pass devices P1 and P2 of the LDO regulator 115 according to one embodiment. The DRVi 602 includes an operational amplifier (OPAMP) 604, a switch SW, resistors R1 and R2, and a capacitor C. One or more of the components may be externally provided, such as, for example the capacitor C. OPAMP 604 has a negative (or inverting) input receiving a reference voltage VREF which is a DC voltage signal that may be developed on the radar IC 104. OPAMP 604 has an output providing a corresponding control signal VCi provided to a control terminal of the pass device Pi. In the illustrated embodiment, Pi is configured as a PNP (or P-type) BJT having a base terminal (the control terminal) and a pair of current terminals including a collector terminal and an emitter terminal. Pi has its emitter terminal coupled to receive a power voltage VPi from the PMIC 102 (generated by a corresponding buck converter BUCKi) and has its collector terminal providing the corresponding supply voltage VSi (which is provided to a supply voltage input of a corresponding radar function RFi).

The collector terminal of Pi is further coupled to one end of the resistor R1 and to one end of the capacitor C. The other end of R1 is coupled to a control node 606 which is further coupled to one end of R2 and to a positive (or non-inverting) input of the OPAMP 604. The other end of C and the other end of R2 are coupled to a supply reference voltage, which may be any suitable reference node such as ground (GND). The switch SW is shown configured as a normally-open, single-pole, single-throw (SPST) switch having a pair of controlled terminals and a control terminal. The output of the OPAMP 604 is coupled to one controlled terminal of SW having its other controlled terminal coupled to GND (or other voltage level, depending on pass device type) and having its control terminal receiving at least one of one or more control signals Ci from the radar controller 112 via the control bus 136. R1 is shown as a programmable or adjustable resistor which may be adjusted to set the voltage level of VSi. In the illustrated configuration, the OPAMP 604 has a supply voltage input receiving VPi (referenced to GND). The same or another one of the control signals Ci from the radar controller 112 is provided to an enable (En) input of the OPAMP 604.

In operation of the DRVi 602 and pass device Pi, the radar controller 112 places the DRVi 602 in the driver mode by enabling the OPAMP 604 and by opening the switch SW (or by keeping it open). Recall that the radar controller 112 also controls the PMIC 102 to set VPi at the upper voltage level UVLi. In the driver mode, the OPAMP 604 regulates the voltage level of VSi using VPi by driving Pi via VCi to maintain the voltage of the control node 606 at VREF. The voltage level of VSi is determined by the voltage level of VREF and by the setting of the adjustable resistor R1. In this manner, the regulation loop between DRVi 602 and Pi has a high PSRR for substantially reducing or effectively eliminating any ripple voltage on VPi so that VSi is regulated at its nominal target level virtually free of ripple voltage. Thus, the radar IC 104 may generate clean HI frames using the corresponding radar function RFi.

The radar controller 112 places the DRVi 602 in the force mode by disabling the OPAMP 604 and by closing the switch SW. Recall that the radar controller 112 also controls the PMIC 102 to set VPi at the lower voltage level LVLi, which is substantially equal to the intended regulated voltage level of VSi. In the force mode, the base terminal of Pi is grounded so that Pi is effectively placed into a bypass mode passing VPi directly to VSi with virtually zero voltage drop. In this manner, any ripple voltage on VPi is passed to VSi and thus to the corresponding radar function RFi used by the radar IC 104 when generating LI frames.

Alternative configurations may be used for the DRVi and Pi. Pi, for example, may be implemented by an NPN (or N-type) BJT with DRVi reconfigured accordingly, such as being supplied by a separate, higher voltage power supply from another buck converter or the like of the PMIC 102. Also, Pi may be implemented an a P-type or N-type MOS or FET or MOSFET type of transistor with DRVi reconfigured accordingly.

Although the present invention has been described in connection with several embodiments, the invention is not intended to be limited to the specific forms set forth herein. On the contrary, it is intended to cover such alternatives, modifications, and equivalents as can be reasonably included within the scope of the invention as defined by the appended claims. For example, variations of positive circuitry or negative circuitry may be used in various embodiments in which the present invention is not limited to specific circuitry polarities, device types or voltage or error levels or the like. For example, circuitry states, such as circuitry low and circuitry high may be reversed depending upon whether the pin or signal is implemented in positive or negative circuitry or the like. In some cases, the circuitry state may be programmable in which the circuitry state may be reversed for a given circuitry function.

The terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

What is claimed is:

1. A radar device comprising:
   a radar function including a supply voltage input and configured to operate with the supply voltage input at a radar supply voltage level, and including a first mode for generating high isolation frames and a second mode for generating low isolation frames;
   a driver configured to control a pass device; and
   a radar controller to configure the driver for controlling the pass device to regulate a radar supply voltage to provide a regulated supply voltage to the supply voltage input of the radar function at the radar supply voltage level when in the first mode, and to configure the driver to force the pass device into a bypass mode to provide the radar supply voltage to the radar function without regulating the radar supply voltage when in the second mode.

2. The radar device of claim 1, wherein the driver is configured to control the pass device in the first mode to regulate supply voltage provided to the radar function with a high power supply rejection ratio, and wherein the driver is configured to force the pass device in the second mode to have zero voltage drop.

3. The radar device of claim 1, wherein the radar controller is configured to instruct an external voltage converter to output a voltage at the radar supply voltage level to the pass device in the second mode or at an upper voltage level that is greater than the radar supply voltage level to the pass device in the first mode.

4. The radar device of claim 1, wherein the driver comprises a low dropout regulator controller that is configured to regulate voltage in the first mode and to force the pass device in the second mode.

5. The radar device of claim 1, wherein the driver is configured to control a bipolar junction transistor as the pass device.

6. The radar device of claim 1, wherein the radar function operates according to a received radar profile for generating a total number of radar frames comprising at least one frame set in which each frame set comprises a first number of high isolation frames followed by a second number of low isolation frames.

7. The radar device of claim 6, wherein the total number and the first and second numbers are determined according to a use case.

8. The radar device of claim 6, wherein one or more of the high isolation frames are used as reference information for spur mitigation applied to the low isolation frames.

9. The radar device of claim 1, wherein the driver comprises:
   an operational amplifier having a first input receiving a reference voltage, a second input coupled to a control node, and an output for coupling to a control terminal of the pass device;
   a first resistor having a first end coupled to the supply voltage input of the radar function and having a second end coupled to the control node;
   a second resistor having a first end coupled to the control node and having a second end coupled to a supply reference node; and
   a switch controlled by the radar controller for selectively coupling the output of the operational amplifier to the supply reference node.

10. A radar sensor comprising:
   a radar device configured to generate radar frames, wherein the radar device has a first mode for generating high isolation frames and has a second mode for generating low isolation frames, and wherein the radar device comprises a radar function having a supply voltage input and is configured to operate with the supply voltage input at a radar supply voltage level;
   a converter including a programmable voltage output, wherein the converter is instructed to output a radar supply voltage at the radar supply voltage level or at an upper voltage level that is greater than the radar supply voltage level;
   a voltage control system comprising a driver coupled to a pass device, wherein the pass device includes current terminals coupled between the voltage output of the converter and the supply voltage input of the radar function and wherein the driver has a control output coupled to a control terminal of the pass device; and
   a radar controller configured to instruct the converter to output a voltage at the upper voltage level and to configure the driver to control the pass device to regulate the voltage to provide a regulated supply voltage to the supply voltage input of the radar function at the radar supply voltage level to configure the radar device in the first mode, the radar controller to instruct the converter to output a second voltage at the radar supply voltage level and to configure the driver to force the pass device in bypass mode to provide the second voltage to the radar function without regulating the second voltage to configure the radar device in the second mode.

11. The radar sensor of claim 10, wherein the driver of the voltage control system controls the pass device in the first mode to regulate supply voltage provided to the radar function with a power supply rejection ratio sufficient to minimize ripple voltage at the voltage output of the converter, and wherein the driver forces the pass device in the second mode to have zero voltage drop between the pass device current terminals.

12. The radar sensor of claim 10, wherein the converter comprises a DC-DC buck converter that outputs voltage with ripple voltage indicative of DC-DC switching.

13. The radar sensor of claim 10, wherein the driver comprises a low-dropout regulator controller and wherein the pass device comprises a bipolar junction transistor.

14. The radar sensor of claim 10, wherein the radar device operates according to a received radar profile to generate a plurality of radar frames comprising at least one frame set in which each frame set comprises a first number of high isolation frames followed by a second number of low isolation frames.

15. A method of generating radar frames, the method comprising:
configuring a radar sensor to generate high isolation frames by:
instructing a supply voltage to be provided at an upper voltage level that is greater than a radar supply voltage level suitable for a radar function of the radar sensor; and
driving a pass device receiving the supply voltage to regulate the supply voltage to provide a regulated supply voltage to the radar function at the upper voltage level; and
configuring the radar sensor to generate low isolation frames by:

instructing the supply voltage to be provided at the radar supply voltage level; and
forcing the pass device in bypass mode to pass the supply voltage at the radar supply voltage level to the radar function without regulating the supply voltage.

16. The method of claim 15, wherein said driving a pass device comprises driving the pass device to regulate voltage at the supply voltage input of the radar function with a power supply rejection ratio sufficient to minimize ripple voltage of the supply voltage for the high isolation frames.

17. The method of claim 15, wherein said forcing the pass device comprises forcing the pass device to have zero voltage drop for the low isolation frames.

18. The method of claim 15, further comprising:
receiving a profile indicating a total number of radar frames to be generated for a radar session, a first number of high isolation frames per frame set and a second number of low isolation frames per frame set of the radar session;
first configuring the radar sensor for generating high isolation frames and generating the first number of high isolation frames;
second configuring the radar sensor for generating low isolation frames and generating the second number of low isolation frames; and
repeating the first and second configuring and generating until the total number of radar frames have been generated.

19. The method of claim 18, further comprising determining the total number, the first number and the second number according to a use case.

20. The method of claim 18, further comprising using one or more of the high isolation frames as reference information for spurt mitigation applied to the low isolation frames.

* * * * *